United States Patent [19]

Bondur et al.

[11] Patent Number: 4,726,879
[45] Date of Patent: Feb. 23, 1988

[54] RIE PROCESS FOR ETCHING SILICON ISOLATION TRENCHES AND POLYCIDES WITH VERTICAL SURFACES

[75] Inventors: James A. Bondur, Walden; Nicholas J. Giammarco, Newburgh; Thomas A. Hansen, Poughkeepsie; George A. Kaplita, New Windsor; John S. Lechaton, Wappingers Falls, all of N.Y.

[73] Assignee: International Business Machines Corporation, Armonk, N.Y.

[21] Appl. No.: 904,437

[22] Filed: Sep. 8, 1986

[51] Int. Cl.$^4$ .................................. H01L 21/308
[52] U.S. Cl. .................................. 156/643; 156/646; 156/648; 156/656; 156/657; 156/659.1; 156/662; 252/79.1; 437/233
[58] Field of Search .............. 156/643, 646, 648, 649, 156/657, 659.1, 662, 656; 252/79.1; 437/233

[56] References Cited

U.S. PATENT DOCUMENTS

| | | | |
|---|---|---|---|
| 3,880,684 | 4/1975 | Abe | 156/8 |
| 4,104,086 | 8/1978 | Bondur et al. | 148/1.5 |
| 4,214,946 | 7/1980 | Forget et al. | 156/643 |
| 4,264,409 | 4/1981 | Forget et al. | 156/643 |
| 4,330,384 | 5/1982 | Okudaira et al. | 204/192 |
| 4,353,777 | 10/1982 | Jacob | 156/643 |
| 4,374,698 | 2/1983 | Sanders et al. | 156/643 |
| 4,380,489 | 4/1983 | Bienvogl et al. | 156/643 |
| 4,447,290 | 5/1984 | Matthews | 156/626 |
| 4,455,193 | 6/1984 | Jeuch et al. | 156/643 |
| 4,465,553 | 8/1984 | Hijikata et al. | 156/643 |
| 4,473,435 | 9/1984 | Zafiropoulo et al. | 156/643 |
| 4,473,436 | 9/1984 | Bienvogel | 156/643 |
| 4,475,982 | 10/1984 | Lai et al. | 156/643 |
| 4,530,736 | 7/1985 | Mutter | 156/643 |
| 4,589,952 | 5/1986 | Behringer et al. | 156/628 |
| 4,595,484 | 6/1986 | Giammarco et al. | 204/298 |

FOREIGN PATENT DOCUMENTS 60-109234   6/1985   Japan .................................. 156/643

OTHER PUBLICATIONS

"Dry Process Technology (Reactive Ion Etching)", J. Vac. Sci. Technol., vol. 13, No. 5, Sep./Oct. 1976, by James A. Bondur, pp. 1023–1029.

Primary Examiner—S. Leon Bashore
Assistant Examiner—Andrew J. Anderson
Attorney, Agent, or Firm—T. Rao Coca

[57] ABSTRACT

Disclosed is a process for etching semiconductor materials with a high etch rate against an insulator mask using a novel etchant gas mixture. The mixture consists of a chlorocarbon (e.g., $CCl_2F_2$, $CCl_4$ or $CCl_3F$), $SF_6$, $O_2$ and an inert gas (e.g. He). The preferred gas mixture contains 2/1 ratio of the chlorocarbon to $SF_6$ and the following composition: 1–4% of $SF_6$, 3–10% of $O_2$, 74–93% of He and 3–10% of chlorocarbon. The etch rate of silicon (or silicide) against an oxide mask using this etchant gas mixture under normal etching conditions is high, on the order of 30–40. An impressive feature of the process is shape control of trenches by mere manipulation of the RIE system power.

22 Claims, 10 Drawing Figures

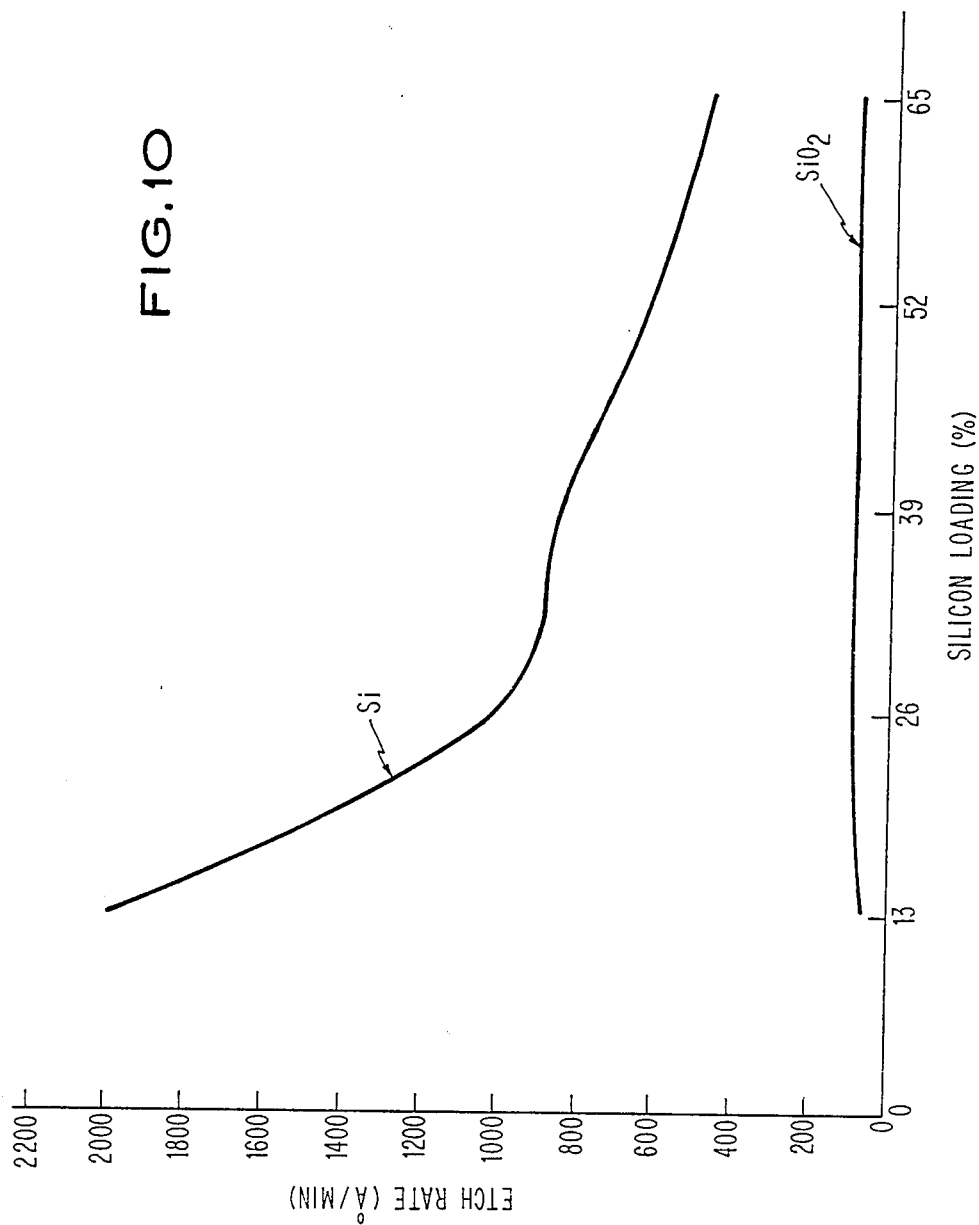

RIE PROCESS FOR ETCHING SILICON ISOLATION TRENCHES AND POLYCIDES WITH VERTICAL SURFACES

BACKGROUND OF THE INVENTION

This invention relates to a reactive ion etching (RIE) process for controllably etching semiconductor materials including silicon bulk and silicide and polycide films to obtain vertical wall profiles. More particularly, the invention is a RIE process characterized by good profile control, high etch selectivity to insulator masks and little toxicity and corrosiveness stemming from use of a novel combination of etchant gases.

RIE is a well-known dry etching technique which finds extensive utility in the fabrication of semiconductor integrated circuits. A major application of RIE is to form deep trenches in a silicon substrate to surround an active or passive semiconductor device and electrically isolate the device. U.S. Pat. No. 4,104,086 issued to Bondur et al and assigned to the present assignee describes the details of the trench isolation process. The trenches are etched after masking portions of the substrate surface with a material (e.g., silicon dioxide or silicon nitride or a combination thereof) which has a lower etch rate than that of silicon. The trenches are then filled with a suitable material such as oxide, polyimide or polysilicon. Another major application of RIE is to define extremely narrow conductor lines (e.g., a gate for field effect transistor or interconnect structure for connecting devices on a substrate) from a deposited film of a refractory metal silicide, polycide (silicide/polysilicon sandwich), etc. In both these applications, it is imperative that the etched surfaces have substantially vertical profile and the (submicron) width of the trench/line be under tight control, lest severe constraints are imposed on the design and fabrication of viable and operable integrated circuits.

A variety of etchant gases and their mixtures have been used in the prior art for RIE of semiconductors. U.S. Pat. No. 4,214,946 to Forget et al and assigned to the present assignee discloses use of a gas mixture consisting of 10 parts of $SF_6$ and $Cl_2$ and the remainder an inert gas (He) for RIE of silicon or polysilicon. While this reference achieves an etch rate ratio (ERR) of Si:-SiO2 exceeding 40:1, it is basically directed to etching shallow (about 0.5 $\mu m$ depth) trenches. Moreover, this process has the fundamental disadvantages of high toxicity and corrosive power which necessitate highly expensive and complicated safety measures during etching. Another disadvantage is that additional process steps are required for making an etch mask of $SiO_2$ because photoresist etch masks cannot withstand these potent gases.

U.S. Pat. No. 4,264,409 to Forget et al and assigned to the present assignee, discloses RIE of silicon or polysilicon using a gas mixture of $SiF_4$, $Cl_2$ and an inert gas (Ar or He). This process suffers from the same drawbacks as the afore mentioned U.S. Pat. No. 4,214,946.

U.S. Pat. No. 4,530,736 issued to Mutter and assigned to the present assignee discloses RIE of Si using 95–99% of $CCl_3F$ or $CCl_2F_2$ in combination with 1–5% of oxygen using a photoresist mask. This patent teaches that oxygen is added to the other gas to increase the etch rate of the photoresist and oxygen does not have significant effect on the etch rate of silicon.

U.S. Pat. No. 4,475,982 issued to Lai et al and assigned to the present assignee discloses RIE of deep trenches in silicon in an atmosphere of $CCl_2F_2$ and Ar to etch the lightly doped layers of silicon and $CCl_2F_2$ and oxygen to etch the heavily doped layers. The switch over to the second atmosphere is made to avoid lateral etching or "blooming" in the heavily doped layers of the silicon substrate.

U.S. Pat. No. 3,880,684 issued to Abe et al describes a semiconductor prepared by continuously etching at least two types of silicon compound layers, such as, $SiO_2$, $Si_3N_4$ or polysilicon which are formed on a silicon substrate. A freon gas plasma is used for etching so that the two types of silicon compound layers are continuously etched in a sloped form with undercutting, as occurs in conventional wet chemical etching.

The article entitled "Dry Process Technology (Reactive Ion Etching)" by J. A. Bondur, J. Vac. Sci. Tech., Vol 13, No. 5, pp. 1023–1029, Sept./Oct. 1976 discloses a variety of gases ($CF_4$, $CCl_2F_2$—Freon 12, etc.) and gas combinations ($CF_4+O_2$, $CF_4+O_2+He$, etc.) for RIE of Si, $SiO_2$, $Si_3N_4$, etc. against a photoresist mask. Bondur concludes that even if the resist mask is square to the wafer surface, it does not insure that a vertical-walled image will result in the etched material since the plasma reacts with the photoresist.

U.S. Pat. No. 4,447,290 issued to Matthews teaches adding Freon 12 to an etchant gas mixture of $SF_6$ and oxygen during plasma etching of polysilicon on a $Si_3N_4$ layer for facilitating detection of the end point of polysilicon etching.

U.S. Pat. No. 4,465,553 issued to Hijikata et al discloses patterning by etching silicon or a compound thereof using a gaseous mixture of $SF_6$ and $C_2ClF_5$.

U.S. Pat. No. 4,473,435 issued to Zafiropoulo et al discloses plasma etching of a polysilicon film to expose a dielectric underlayer on a silicon substrate by using a gas mixture of $SF_6$ (or $CF_4$ or $NF_3$) and Freon ($C_2ClF_5$).

U.S. Pat. No. 4,473,436 issued to Beinvogl discloses RIE of a polycide layer using a preferred gas mixture of $SF_6$ and $Cl_2$. The patentee states that "the invention can also be practiced by using gas mixtures which contain fluorohydrocarbons that are substituted with chlorine atoms" (i.e. fluoro-chlorocarbons) such as $CClF_3$, $CCl_2F_2$ and mixtures thereof. Further, a carrier gas, preferably an inert gas, such as helium, "can also be utilized in the practice of the invention".

U.S. Pat. No. 4,330,384 issued to Okudaira et al discloses plasma etching of silicon with a gas mixture containing $SF_6$ and at least one of $O_2$, $NH_3$, $N_2$, $CF_4$ and $CH_4$.

U.S. Pat. No. 4,455,193 issued to Jeuch et al discloses simultaneously etching photoresist and oxide layers using a mixture of $CHF_3$ (or $CF_4$) and $O_2$. Other disclosed etchant gases are $SF_6$ and a mixture of $CF_4$ and oxygen.

U.S. Pat. No. 4,380,489 issued to Benivogl discloses plasma etching of polysilicon using $SF_6$ and He reactive gas mixture.

U.S. Pat. No. 4,374,698 issued to Sanders et al discloses plasma etching a $Si_3N_4$ or $SiO_2$ layer using a gas mixture which contains a fluoride compound ($CF_4$ or $CHF_3$) and a compound which contains a halogen other than a fluoride (such as $CF_2Cl_2$).

U.S. Pat. No. 4,589,952 issued to Behringer and assigned to the present assignee discloses RIE of deep trenches in silicon against a triple photoresist-$Si_3N_4$-photoresist mask using $CF_4$ etchant ambient containing a low fluorine concentration to obtain a substantially vertical trench wall profile.

Despite the plethora of prior art on RIE etchant gas systems, there exists a strong need for an etchant gas chemistry which is capable of consistently and reliably providing deep and narrow silicon trenches with controlled wall profiles. A similar need exists with respect to patterning fine and ultrafine conductor lines with vertical surface profiles. These needs are particularly acute due to the insatiable demands imposed by the requirements of increased device density on a chip. Coupled to the chip density demands is the safety-at-workplace and environmental considerations making it imperative to avoid altogether any toxic or corrosive gas system. The prior art gas systems which utilize $Cl_2$ as a component of the etchant gas fails to meet these requirements due to its inherent corrosive and toxic nature. The gas systems which do not use $Cl_2$ tend to be incapable of providing consistently and reliably controlled wall profiles. Unacceptable trench contour aberrations such as trench sidewall bowing are characteristic of these systems.

Over and beyond the needs stipulated above, there exists a need to controllably alter the shape or pitch of isolation trenches to suit the particular trench-filling material and facilitate reliable trench isolation. For example, for filling trenches with an organic material such as polyimide, it is desirable to etch trenches having a negative pitch (i.e., the bottom of the trench is wider than the top) since, then, the organic will flow down along the trench surfaces and achieve capillary action to fill the trench without forming voids in the organic fill. While filling the trench with polysilicon, for example, a trench profile with a positive pitch (narrower at the bottom than at the top) is desired to prevent formation of large voids in the polysilicon-fill. The prior art failed to address these demands.

Accordingly, it is an object of the invention to provide a process for etching a semiconductor material to obtain controllable wall profiles thereof.

It is another object of the invention to provide an RIE gas system which has a high etch selectivity of a semiconductor against an insulator mask.

It is a specific object of the invention to provide a RIE process for etching trenches in a semiconductor material by manipulating the composition of the component gases in the etchant gas system and/or the RIE process parameters.

SUMMARY OF THE INVENTION

The above objects and other related objects may be achieved through the use of a novel etchant gas mixture composed of a chloro-carbon, $SF_6$, oxygen and an inert gas such as helium. Suitable chloro-carbon include $CClF_3$ (Freon 13), $CCl_2F_2$ (Freon 12), $CCl_3F$ (Freon 11), $CCl_4$, the preferred chloro-carbon being $CCl_2F_2$. The preferred proportion of the chloro-carbon to $SF_6$ in the gas mixture is approximately 2. The etchant gas mixture being suitable for use, among others, with a single- or multi-wafer diode-configured parallel-plate RIE system, lends itself to etching deep and narrow trenches in a semiconductor substrate and patterning polycide, silicide and other films into fine lines having substantially vertical wall profiles. In the trench definition context, the gas mixture permits shape control of the trench (to provide a positive, negative or zero pitch to the trench) by mere control of the RF power applied to the RIE system while strictly maintaining the width of the opening in the trench-definition mask. The presence of the oxygen facilitates a high ERR of semiconductor material to the insulator mask by decreasing the etch rate of the insulator. For example, ERR of Si:SiO$_2$=30–40:1.

BRIEF DESCRIPTION OF THE DRAWINGS

The novel process steps and their combination characteristic of the invention are set forth in the appended claims. The invention itself, however, will be best understood by reference to the detailed description which follows in conjunction with the accompanying drawings, wherein:

FIG. 10 is a graphical illustration of the effect of silicon loading on etch rate of silicon and silicon dioxide.

DETAILED DESCRIPTION OF THE INVENTION

The invention can be practiced using any of the RIE systems well-known in the art. One such RIE system is disclosed in U.S. Pat. No. 4,595,484 issued to Giammarco et al and assigned to the present assignee. This patent is hereby incorporated by reference herein. Since such a system is not the subject of the present invention, the detailed description will focus on the novel RIE method utilizing a novel gas mixture rather than on the RIE system.

Figure 1:
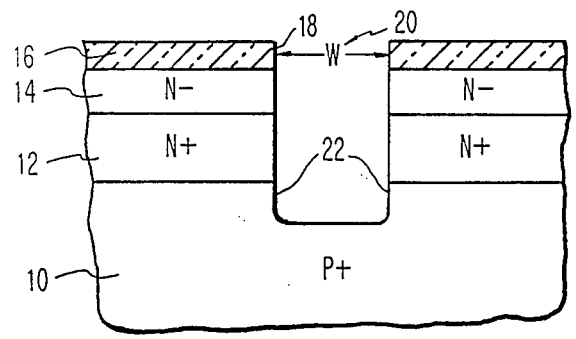
FIG. 1 illustrates in cross-sectional representation RIE of silicon in accordance with the present process to form deep trenches having vertical walls and a width identical to that of the opening in the RIE mask.

Referring now particularly to FIG. 1, the RIE for one form of the present invention for forming dielectric trench isolation is shown. The structure of FIG. 1 includes a monocrystalline silicon substrate 10 which is shown as P+ conductivity for purposes of illustration, an N+ layer 12 over the substrate 10 and an N− conductivity layer 14 on the layer 12. For purposes of the invention, either all or some of the layers 10, 12 and 14 could be of opposite conductivity from the conductivity type indicated. However, it is preferred to have the layer 12 to be in a conductivity region where it will ultimately be the collector of a bipolar transistor. The structure can be fabricated by various well-known techniques. However, the preferred technique is to provide a monocrystalline silicon substrate and to diffuse an N+ blanket diffusion into the substrate by using conventional diffusion or ion implantation of an N type impurity such as arsenic, antimony or phosphorus to produce an N+ region with a surface concentration of between about $10^{19}$ and $10^{21}$ atoms/cc. The layer 14 is subsequently grown on to the 10-12 structure by means of an epitaxial growth. This may be done by conventional techniques such as use of $SiCl_4/H_2$ or $SiH_4/H_2$ mixtures at growth temperatures of about 1000° C. The N+ layer 12 may have a typical thickness of about 1-3 μm whereas the epitaxial layer has a thickness of about 0.5-10 μm, the exact thicknesses being depending on the device to be built.

Next, a silicon dioxide layer 16 is formed by conventional techniques of either thermal growth at a temperature of about 950° C. in a wet or dry oxygen ambient or by chemical vapor deposition. Other mask materials may also be used such as silicon nitride and aluminum oxide. Openings 18 having a width W are formed in the oxide 16 in the regions where dielectric isolation is desired. These openings are formed by the conventional photolithography and etching techniques. The thickness of masking layer 16 is about 0.2-2 μm, the exact thickness depending on the depth requirement of the silicon trench.

The structure is now ready for the reactive ion etching process, per the invention. This process may be more fully understood with reference to the aforementioned Giammarco et al patent which contains a full description of the RIE apparatus. The substrate structure 10-12-14-16 shown in FIG. 1 is mounted on the cathode plate of the RIE apparatus. After proper evacuation of the reaction chamber, an etchant gas mixture consisting of a chlorocarbon, $SF_6$, oxygen and an inert gas is introduced into the chamber. The preferred chlorocarbon gas is $CCl_2F_2$ (Freon 12) and the preferred inert gas is He. If w designates the percentage of the helium gas, x designates the percent of Freon-12, y designates that of $SF_6$ and z designates the percentage of oxygen gas in the etchant gas mixture, the sum total of w, x, y and z should be about 100. Additionally, best control of the etching process is obtained when Freon-12 is about twice as much as SF6 in the gas mixture, i.e., when $x/y=2$. The preferred gas mixture which would facilitate a high etch rate ratio of semiconductor to insulator while providing excellent controllability of the etching process has a Freon-12 content of about 3%-10%, $SF_6$ of about 1%-4%, $O_2$ of about 3%-10% and He content of about 74%-93%.

The component gases of the etchant gas mixture are introduced into the RIE system via the inlet port thereof using individual flow controllers external to the inlet port. By controlling the flow rate of the component gases, the percent content of the gases in the mixture is controlled. Since the distance between the flow controllers and the reaction volume is substantially large, the component gases mix homogeneously prior to diffusion into the reaction volume. The pressure in the chamber is maintained independently by a throttle valve at the chamber outlet. The flow rates and the pumping speed are adjusted such that the etchant gas mixture remains in the process chamber for an optimum period of time to balance the buildup and decline of the active species which are responsible for etching, but not so long that the byproducts of the reaction seriously inhibit the reaction. A chamber pressure of below about 100 millitorr is typically used and the flow rates of the etchant gas are adjusted to obtain the previously mentioned composition ranges.

Radiofrequency (RF) power is applied to the substrate-mounting plate to effectively negative bias this plate with respect to the anode. An RF on the order of 13.56 MHz delivering a suitable power is used. The power level is dictated, to a degree, by the size of the cathode plate. For a 16-inch diameter plate, a power of about 200-400 watts or a power density of about 0.1-0.4 watt/sq cm is typically used.

Under these conditions the silicon substrate 14-12-10 (FIG. 1) is etched against the RIE mask 16 to form a deep and narrow trench 20 having substantially vertical walls 22. The ERR of silicon to oxide is high, about 30-40:1. This high ERR avoids any erosion and lifting of the oxide mask 16, thereby facilitating excellent control over the opening 18 in the mask. The wall profile is vertical over the entire depth of the trench regardless of the doping profile or type of dopant incorporated into the substrate, as illustrated in FIG. 1. Since the wall profile is vertical, the width of the trench will be substantially the same as the width W of the opening 18 in the mask 16.

It is not clear what specific mechanism gives rise to the high ERR and vertical wall profile. However, oxygen, despite its low content in the etchant gas mixture, is a necessary and key ingredient of the etchant gas mixture responsible for the high ERR. A plausible explanation for the vertical wall profile is as follows. The RF field generates the etchant species by suitably breaking up the molecules of the etchant gas. The Freon gas provides a species which passivates the vertical surfaces of silicon preventing lateral etching thereof by radicals in the etchant gas responsible for etching. In other words, Freon provides "Cl" species which are chemisorbed onto the silicon trench surfaces forming a barrier on the surfaces preventing or "protecting" the vertical surfaces from any significant etching. Simultaneously, "F" radicals supplied by Freon and $SF_6$ molecules in the etchant gas, by virtue of their high momentum in a substantially vertical direction gained from the RF field and ability to chemically interact with the silicon, react spontaneously with the horizontal surface of the trench causing etching in a vertical direction. The vertical etch rate is a function of the RF power applied to the structure 14-12-10. As the power is increased, the etch rate is correspondingly increased due to the increased energy imparted to the etching species. The increased energy results in increased temperature of the substrate. It is believed that increased temperature of the substrate causes the trench to widen at the bottom as RF power is increased. The increase in thermal energy causes the sidewall passivation to diminish, so lateral etching will occur.

Figure 2:
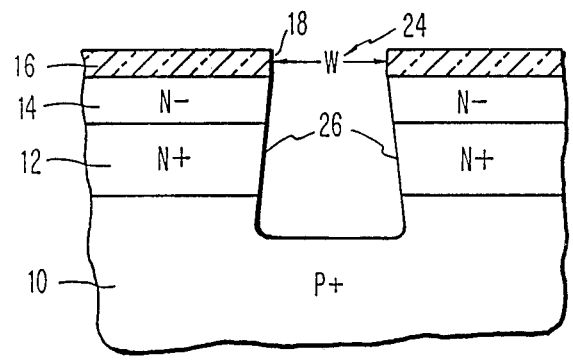
FIGS. 2 and 3 illustrate in cross-sectional representation RIE of silicon in accordance with the invention to form deep trenches of varying shape (positive and negative pitch, respectively) by varying the power for generating the RIE species.
Figure 3:
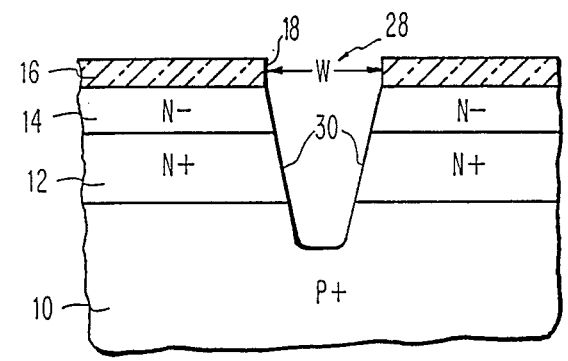

The unique four-component etchant gas mixture has the advantageous feature of image shape control. As illustrated in FIGS. 2 and 3, utilizing this gas mixture, the shape of the trench can be conveniently altered to have a negative or positive pitch by merely changing the power density of the RIE system. By increasing the power density from that used to obtain the substantially vertical trench profile illustrated in FIG. 1, a trench 24 having a negative pitch as indicated in FIG. 2 may be obtained. The sidewalls 26 of the trench 24 are outwardly sloped. Likewise, by decreasing the power density of the RIE system below that used for obtaining the wall profile of trench 20 (FIG. 1), a trench 28 having a positive pitch comprised of inwardly sloping walls 30 is obtained. As indicated in FIGS. 2 and 3, variation of RIE system power, however, has little effect on the width W of the opening in the oxide mask 18. This is particularly advantageous from a circuit design standpoint since the width of the trench at the top corresponds exactly to that defined by lithography.

Figure 5:
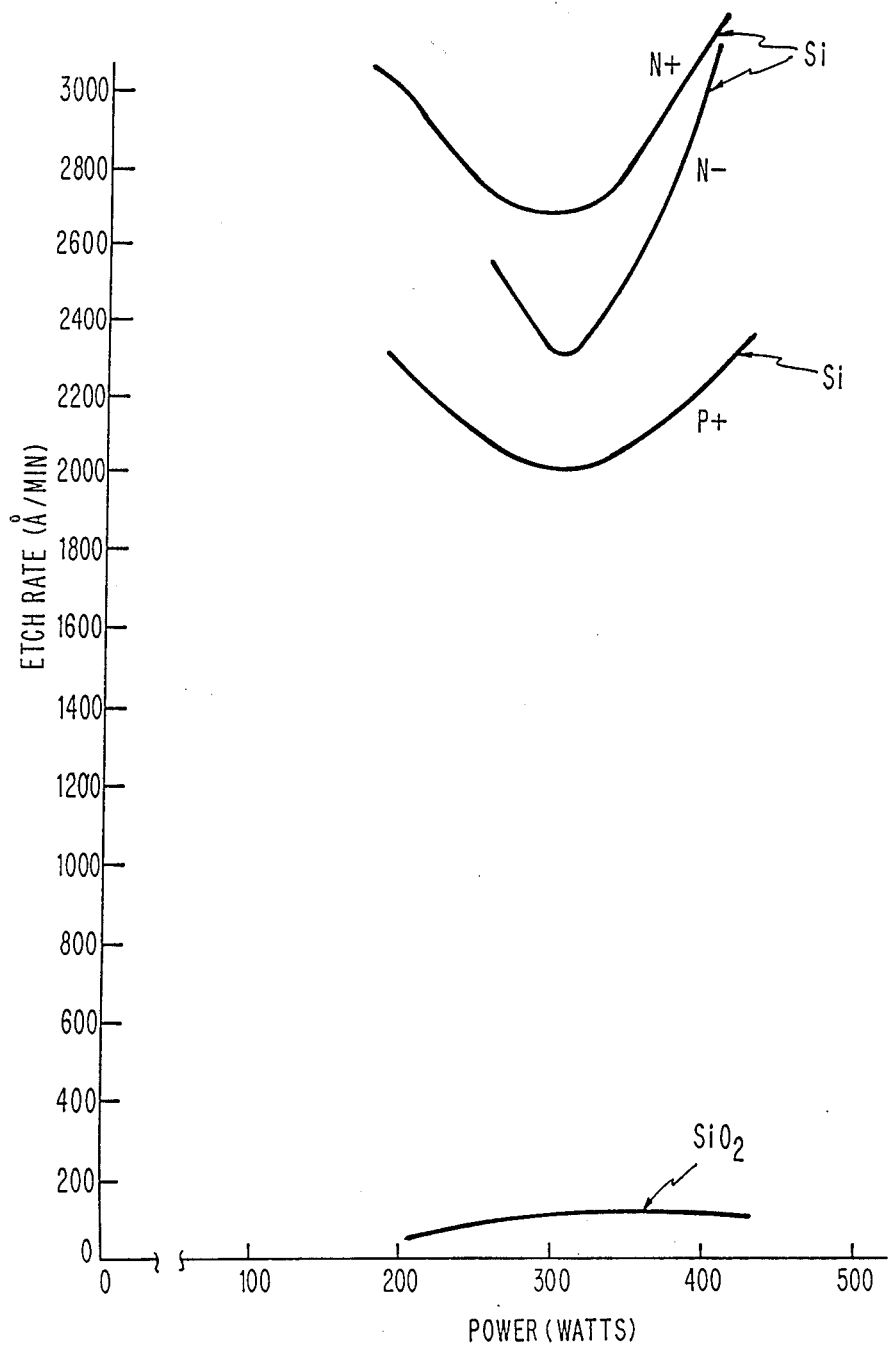
FIG. 5 is a graphical illustration of the dependence of etch rate of polysilicon and oxide on power.

The above trench shape control may be understood by reference to FIG. 5 which graphically illustrates the dependence of etch rate on power for silicon and silicon dioxide materials. The data corresponds to the following etching conditions: pressure=75 mT; flow rates (and the equivalent percent content) of the component gases are 55 sccm (or 86%) of He, 4 sccm (or 6.25%) of $CCl_2F_2$, 3 sccm (or 4.7%) of $SF_6$ and 2 sccm (or 3.15%) of $O_2$; silicon load of 12%; the diameter of the cathode plate was about 40 cm; temperature of cathode plate is room temperature. The silicon etch rate is a nonlinear function of the power, exhibiting a high etch rate above about 150 watts and decreasing rapidly to zero as the power is reduced to zero. At a power setting of about 200 watts, the trench has a positive slope. At higher power levels, the slope becomes zero and then turns negative. The silicon dioxide etch rate graph, on the other hand, is free of such variation indicating that the oxide etch rate is quite unaffected by the power. Also evident from FIG. 5 is that the ERR of silicon to silicon dioxide is high in the range 30-40:1; and the variation of the etch rate of silicon at a given power level with doping conditions is not significant indicating that the present novel process enables etching a silicon material of the type shown in FIG. 1 having doped layers 10, 12 and 14 to yield a substantially vertical profile.

Figure 6:
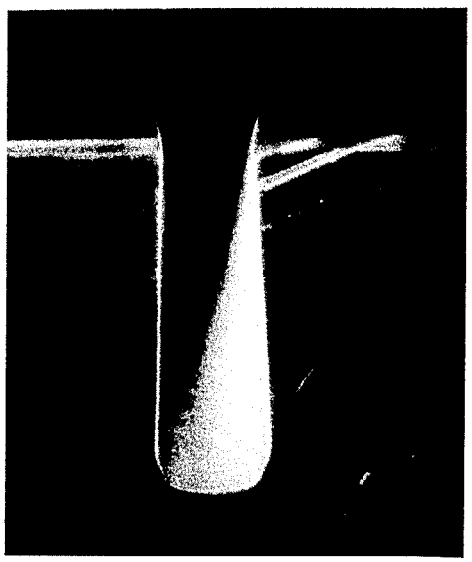
FIGS. 6 and 7 are photographs made by scanning electron microscopy of trenches formed in silicon using the process of the present invention by merely changing the power.
Figure 7:

Dramatic results of the above graphical data is shown in FIGS. 6 and 7 which are photographs made by a scanning electron microscope of a trench in silicon using the process conditions stipulated with regard to the FIG. 5 data. The negatively pitched trench shown in FIG. 6 was obtained using a power level of 400 watts. The positively pitched trench of FIG. 7 was obtained using a power of 200 watts. It is readily apparent from these figures that the silicon trench shape is amenable for change by using the four component gas mixture and merely manipulating the power employed for etching. Also, evident from FIGS. 6 and 7 is that there is no black silicon (i.e., grass, cones, spikes, etc.) formation at the bottom of these 12 μm deep trenches.

Figure 4:
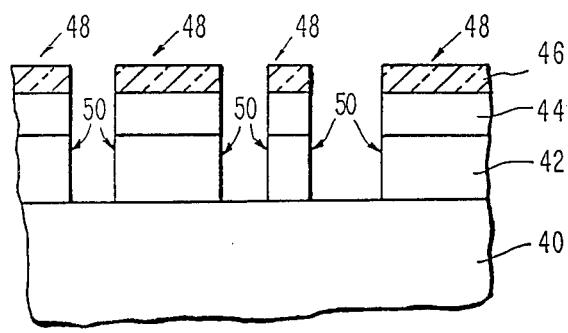
FIG. 4 illustrates in cross-sectional representation RIE patterning of a polycide layer in accordance with the present invention into conductors having well-defined and vertical wall profile.

Equally impressive results are obtained in accordance with the present process while patterning silicide and polycide layers by etching into fine lines. This is illustrated in FIG. 4. Starting with a silicon substrate having a 200-400 nm thick doped or undoped polysilicon layer 42, 150-300 nm thick refractory metal silicide (e.g., $TiSi_2$, $TaSi_2$ or $WSi_2$) layer 44, a silicon dioxide layer 46 is formed. The oxide 44 is a low temperature oxide (LTO) typically formed at a low temperature of about 400° C. Using conventional photolithography and etching using 100% $CF_4$ plasma, the oxide layer 46 is patterned into a configuration desired of the underlying polycide 42-44. Once the oxide is patterned into a RIE mask for the polycide layer, the structure is subjected to the present etching process using the combination of chlorocarbon, $SF_6$, $O_2$ and an inert gas. In a preferred embodiment, the $CCl_2F_2+SF_6+O_2+He$ gas mixture is used in the same percentage rates as in the case of etching silicon described hereinabove. Under suitable power density the plasma derived from this gas mixture facilitates etching the silicide 44 and polysilicon 42 into the conductor structures 48 with perfectly vertical walls 50. Since the etch rate of the oxide mask 42 is substantially low (nearly 30-40 times low) compared to that of layers 42 and 44 the integrity of the oxide mask is preserved and any undercutting beneath the mask is avoided.

Figure 8:
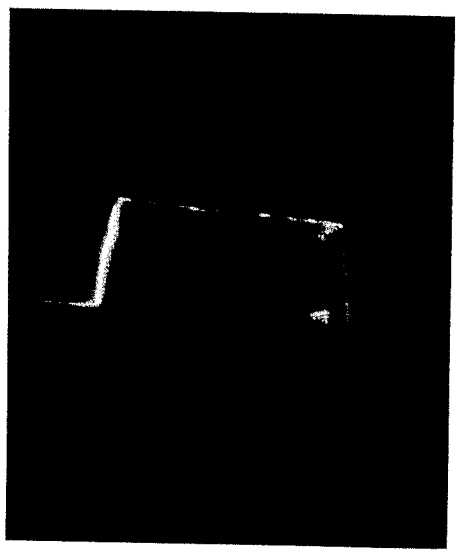
FIGS. 8 and 9 are photographs made by scanning electron microscopy of polycide lines etched from a polycide film using the novel etchant gas system of the invention.
Figure 9:
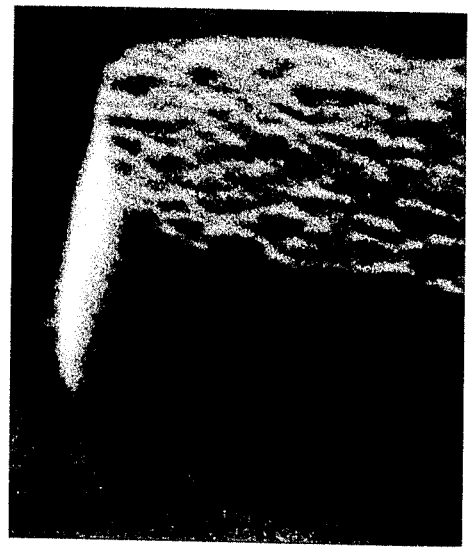

FIGS. 8 and 9 are photographs made by scanning electron microscope of a $LTO/TiSi_2$/polysilicon sandwich layer using the process of the present invention. FIG. 8 shows the sandwich structure in a crosssectional view and FIG. 9 shows a side view. The thickness of the LTO, $TiSi_2$ and polysilicon were, respectively, 370 nm, 200 nm and 370 nm. The etching was carried out under the following conditions:

Flow rate
  He—54 sccm
  $CCL_2F_2$—4
  $SF_6$—2
  $O_2$—2.5
Pressure 55 mT
Power 260 Watts
Cathode size 40 cm Under these conditions, the $TiSi_2$ was etched at a rate of about 500 A/min. and the polysilicon was etched at a rate of about 800 A/min. obtaining a conductor structure with near vertical walls. The polysilicon etch rate was low compared to that shown in FIG. 5 because the silicon loading on the cathode surface (which affects the etch rate as illustrated in FIG. 10) was significantly higher than 12%.

In summary, the RIE process comprised of a novel gas mixture of $CCl_2F_2$, $SF_6$, $O_2$ and He enables deep and narrow silicon trench etching. The resulting trenches have near perfect vertical walls, free of blooming, dove tailing, black silicon and other problems that plagued the prior art. The process is readily extendable to etching silicide and polyside layer patterning into fine line patterns. The process enables shape control of trenches by manipulating the RIE power. It is free of toxic and corrosive reaction components and suitable for use with a variety of RIE systems.

Thus, there has been described in accordance with the invention a RIE process that fully satisfies the objects and advantages set forth above.

While the invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as fall within the scope and spirit of the invention.

We claim:

1. A method for anisotropic etching of a semiconductor material comprising:
   providing a semiconductor material having an inorganic material mask thereon; and
   subjecting said material to a plasma consisting of w percent inert gas, x percent chlorocarbon, y percent $SF_6$ and z percent $O_2$ wherein $w+x+y+z$ is 100% and each of said w,x,y and z percentages exceeds 0%.

2. The method as recited in claim 1 wherein x is approximately 2y.

3. The method as recited in claim 1 wherein said chlorocarbon is selected from the group consisting of $CCl_2F_2$, $CCl_4$, $CCl_3F$ and $CClF_3$.

4. The method as recited in claim 1 wherein said inert gas is helium.

5. The method as recited in claim 4 wherein said chlorocarbon is $CCl_2F_2$.

6. The method as recited in claim 5 wherein said material is silicon.

7. The method as recited in claim 6 wherein w is approximately 74-93%, x is approximately 3-10%, y is approximately 1-4% and z is approximately 3-10%.

8. The method as recited in claim 6 wherein said mask material is selected from a group consisting of silicon dioxide, silicon nitride and aluminum oxide.

9. The method as recited in claim 5 wherein said material is polycide.

10. A method of forming trenches in a semiconductor material comprising:
   providing a semiconductor material having an inorganic material mask thereon; and
   subjecting said material to an RF plasma consisting essentially of w percent of an inert gas, x percent of a chlorocarbon, y percent of $SF_6$ and z percent of $O_2$ where said w,x,y, and z is each greater than zero and w+x+y+z is essentially one hundred percent to etch the regions of said material not masked by said mask.

11. The method as recited in claim 10 wherein said chlorocarbon is selected from the group consisting of $CCl_2F_2$, $CCl_3F$, $CClF_3$ and $CCl_4$.

12. The method as recited in claim 10 wherein said inert gas is helium.

13. The method as recited in claim 10 wherein said material is silicon.

14. The method as recited in claim 13 wherein said inert gas is helium and said chlorocarbon is $CCl_2F_2$.

15. The method as recited in claim 14 wherein x=2y.

16. The method as recited in claim 15 wherein said mask is composed of silicon dioxide and the etch rate ratio of silicon to silicon dioxide is about 30-40:1.

17. The method as recited in claim 13 wherein said silicon material includes upper and lower regions of first and second conductivity types.

18. The method as recited in claim 10 wherein said trench has substantially vertical walls.

19. The method as recited in claim 18 including changing the shape of said trench from one having zero pitch to one having a positive pitch by decreasing the power density to below that used for etching said trench with zero pitch.

20. The method as recited in claim 18 including changing the shape of said trench from one having zero pitch to another having a negative pitch by increasing the power density to above that used for etching said trench with zero pitch.

21. A method of patterning a metal silicide and polysilicon dual layer by anisotropic etching comprising:
   providing a metal silicide and polysilicon dual layer having an inorganic mask thereon; and
   subjecting said layer to a plasma composed of $CCl_2F_2$, He, $O_2$ and $SF_6$.

22. The method as recited in claim 21 wherein said plasma is composed of approximately 3-10% of $CCl_2F_2$, 1-4% of $SF_6$, 3-10% of $O_2$ and 74-93% He.

* * * * *